(12) United States Patent
Kang

(10) Patent No.: US 6,285,611 B1
(45) Date of Patent: Sep. 4, 2001

(54) MEMORY DEVICE HAVING INPUT AND OUTPUT SENSE AMPLIFIERS THAT OCCUPY LESS CIRCUIT AREA

(75) Inventor: Kyung-Woo Kang, Kyungki-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/596,331

(22) Filed: Jun. 16, 2000

(30) Foreign Application Priority Data

Jul. 14, 1999 (KR) ................................. 99-28399

(51) Int. Cl.[7] ........................................ G11C 7/00
(52) U.S. Cl. ................................ 365/205; 365/208
(58) Field of Search ............................ 365/205, 207, 365/208, 230.03

(56) References Cited

U.S. PATENT DOCUMENTS 5,315,555 * 5/1994 Choi ........................................ 365/207
6,046,924 * 4/2000 Isobe et al. ............................. 365/51
6,104,655 * 8/2000 Tanoi et al. ........................... 365/205

* cited by examiner

Primary Examiner—Son Mai
(74) Attorney, Agent, or Firm—Skjerven Morrill MacPherson LLP; David W. Heid

(57) ABSTRACT

A memory device includes a plurality of memory banks, a plurality of data line pairs coupled to the memory banks, and an input/output (IO) sense amplifier shared by at least two neighboring memory banks. The IO sense amplifier includes a plurality of current sense amplifiers and a latch sense amplifier. Each current sense amplifier couples to and senses a corresponding data line pair. The latch sense amplifier selectively senses signals from the plurality of current sense amplifiers and generates an output signal at a suitable voltage for peripheral circuitry. Circuit area required for sense amplifiers is reduced because at least two memory banks share a latch sense amplifier, instead of having one latch sense amplifier for each memory bank.

6 Claims, 3 Drawing Sheets

MEMORY DEVICE HAVING INPUT AND OUTPUT SENSE AMPLIFIERS THAT OCCUPY LESS CIRCUIT AREA

BACKGROUND OF THE INVENTION

1. Field of the Invention

The present invention relates to semiconductor memory devices such as synchronous DRAMs and to input/output (IO) sense amplifiers that require less area in a semiconductor memory.

2. Description of the Related Art

Synchronous DRAMs (dynamic random access memories) improve the operational speed by operating a data pipeline in synchronization with a system clock signal. Accordingly, synchronous DRAMs can receive and input the address for a next memory access while current data is being processed and output. The synchronous DRAMs constantly output data from a plurality of banks and are thus faster than conventional DRAMs, which have idle time between receipt of an address and output of data.

To maintain the continuous output of data, each bank of a conventional synchronous DRAM has separate data lines and IO sense amplifiers. For example, an SDRAM with a 16-bit data width requires 16 data lines and 16 IO sense amplifiers per bank. Assuming that a memory device has four memory banks, the memory device requires 64 (4×16) IO sense amplifiers.

Recent development of multi-media technology has increased the demand for semiconductor memory devices having larger data widths. Accordingly, semiconductor memory devices having a large data width including memories with 32-bit or 64-bit data widths are being developed. This increase in the data width means an increase in the number of data lines and IO sense amplifiers, which directly causes an increase in the chip area. The larger chip area can decrease the number of semiconductor memory devices produced per wafer and can correspondingly increase the costs of the memory devices.

SUMMARY OF THE INVENTION

To solve the above problems, the present invention provides a semiconductor memory device in which IO sense amplifiers occupy less integrated circuit area. In one embodiment of the invention, a memory device includes a plurality of memory banks, a plurality of data line pairs connect to the memory banks, and an input/output (IO) sense amplifier that at least two neighboring memory banks share. The IO sense amplifier selectively amplifies or senses data signals on the data lines of one of the at least two memory banks. The sharing of IO sense amplifiers means that the total circuit area that sense amplifiers occupy in a memory device is less than the circuit area that would be required if each bank had a separate IO sense amplifier.

In one particular embodiment, the IO sense amplifier includes a latch sense amplifier and at least two current sense amplifiers. Each current sense amplifier connects to a data line pair of a corresponding one of the at least two memory banks and senses differences in currents flowing through the connected data lines. An output voltage from each current sense amplifier indicates a result of the current sensing. The latch sense amplifier connects to the at least two current sense amplifiers, for sensing the output voltage from a selected one of the current sense amplifiers. The latch sense amplifier amplifies the sensed output voltage to a level that is enough for transfer to a peripheral circuit. Since at least two neighboring memory banks share the latch sense amplifier, the total layout area of the IO sense amplifiers in a memory is reduced, when compared to a memory in which each memory bank has a current sense amplifier and a latch sense amplifier.

BRIEF DESCRIPTION OF THE DRAWINGS

The above aspects and advantages of the present invention will become more apparent by describing in detail an exemplary embodiment thereof with reference to the attached drawings in which.

Use of the same reference symbols in different figures indicates similar or identical items.

DESCRIPTION OF THE PREFERRED EMBODIMENT

For a better understanding of the operation and advantages of the present invention, the exemplary embodiment of the present invention will be described with reference to the accompanying drawings.

Figure 1:
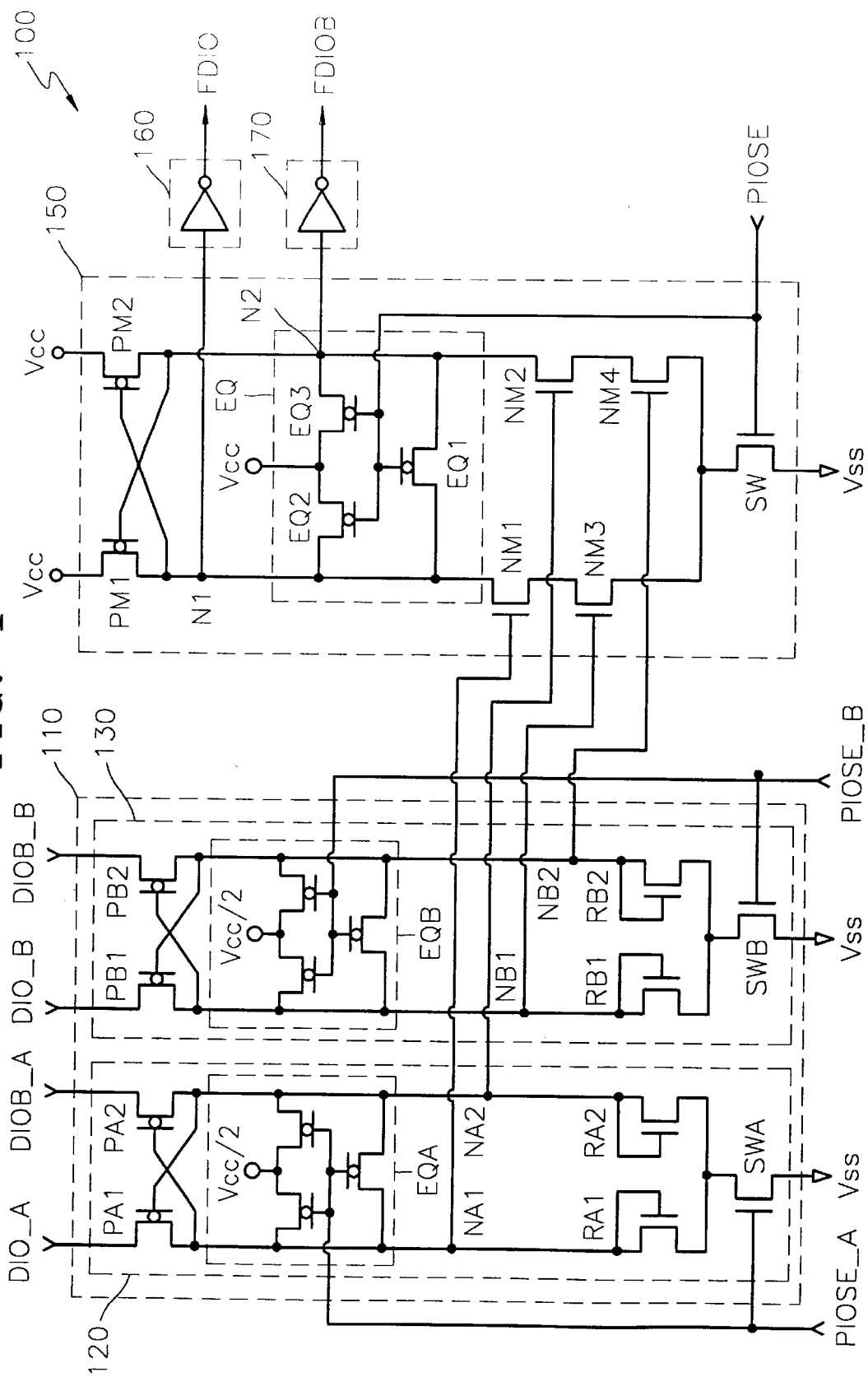
FIG. 1 is a circuit diagram of an IO sense amplifier according to an exemplary embodiment of the present invention.

FIG. 1 is a circuit diagram of an IO sense amplifier according to the exemplary embodiment of the present invention. For convenience, only one IO sense amplifier 100 is illustrated. In a memory device, the number of IO sense amplifiers depends on the number of pairs of data lines in each memory bank (e.g., the data width) and the number of memory banks that share each IO sense amplifier. The IO sense amplifier 100 connects to a first pair of data lines DIO_A and DIOB_A and a second pair of data lines DIO_B and DIOB_B from two neighboring memory banks A and B, which share the sense amplifier 100. In FIG. 1, the suffix "A" in the various reference symbols implies elements related to the memory bank A, and the suffix "B" in the various reference symbols implies elements related to the memory bank B. In alternative embodiments, the IO sense amplifier can connect to more than two banks through the addition of further copies of the elements associated with specific banks.

The IO sense amplifier 100 selectively sense-amplifies data from one of the data line pairs DIO_A and DIOB_A or DIO_B and DIOB_B of a selected memory bank A or B. More particularly, first and second sense amplifier enable signals PIOSE_A and PIOSE_B are respectively activated for sensing data lines of the memory banks A and B when the memory device enters a read mode.

The IO sense amplifier 100 includes a current sense amplifier block 110 for sense-amplifying current on the select data lines, and a latch sense amplifier 150 for amplifying an output signal from the current sense amplifier block 110. The current sense amplifier 110 includes first and second current sense amplifiers 120 and 130 that the first and second sense amplifier enable signals PIOSE_A and PIOSE_B control. The first and second current sense amplifiers 120 and 130 can be included in the memory banks A and B, respectively, and operate to sense and amplify differences in current flowing through the respective data line pairs DIO_A, DIOB_A and DIO_B, DIOB_B. In particular, when the enable signal PIOSE_A is activated, the first current sense amplifier 120 senses and amplifies the data signals on the data line pair DIO_A and DIOB_A of the memory bank A. When the enable signal PIOSE_B is activated, the second current sense amplifier 130 senses and amplifies the data signals on the data line pair DIO_B and DIOB_B of the memory bank B. The first and second current sense amplifiers 120 and 130 are thus, responsive to the first and second sense amplifier enable signals PIOSE_A and PIOSE_B but are constructed in essentially the same manner.

The memory banks A and B share the latch sense amplifier 150. The latch sense amplifier 150 receives output signals of the first and second current sense amplifiers 120 and 130 and senses a slight difference in the voltage levels generated by the first or second current sense amplifier 120 or 130. The latch sense amplifier 150 amplifies the slight difference to a level large enough for transfer to peripheral circuits. The elements of the latch sense amplifier 150 are typically larger than the elements of the current sense amplifiers 120 and 130. In terms of layout area, the latch sense amplifier 150 occupies 70 to 80% of the overall area of the IO sense amplifier 100. Since two memory banks share the latch sense amplifier 150, which occupies 70 to 80% of the overall area of the IO sense amplifier 100, the area occupied by the IO sense amplifier 100 is 35% to 40% less than the combined area of two sense amplifiers of conventional configuration.

The first and second current sense amplifiers 120 and 130 and the latch sense amplifier 150 shown in FIG. 1 are described in more detail below. Since the first and second current sense amplifiers 120 and 130 are essentially the same, only the first current sense amplifier 120 is described in detail.

The first current sense amplifier 120 includes first and second load transistors PA1 and PA2, an equalizer EQA, first and second load resistors RA1 and RA2, and a switch SWA.

In FIG. 1, the first and second load transistors PA1 and PA2 are PMOS transistors having matched electrical characteristics. The sources of the first and second load transistors PA1 and PA2 respectively connect data lines DIO_A and DIOB_A, and the gates and drains are cross-coupled. Also, the respective drains of the load transistors PA1 and PA2 connect to the signal nodes NA1 and NA2 of the first current sense amplifier 120.

In the embodiment of FIG. 1, the first and second load resistors RA1 and RA2 are NMOS transistors. Here, the respective drains and gates of the NMOS transistors are connected together, and the drains thereof are respectively connected to the drains of the first and second load transistors PA1 and PA2, that is, the signal nodes NA1 and NA2. The first and second load resistors RA1 and RA2 have matched electrical characteristics and in particular, have the same resistance.

The switch SWA is an NMOS transistor in FIG. 1. Here, the drain of the NMOS transistor connects to the sources of the load resistors RA1 and RA2, and the source of the NMOS transistor connects to the ground voltage Vss. The first sense amplifier enable signal PIOSE_A when activated turns on the switch SWA.

The equalizer EQA when enabled keeps the signal nodes NA1 and NA2 at the same voltage (about Vcc/2 in FIG. 1). In the exemplary embodiment, the equalizer EQA includes a transistor coupled between the signal nodes NA1 and NA2, a transistor coupled between a precharge voltage and the signal node NA1, and a transistor coupled between the precharge voltage and the signal node NA2. The equalizer EQA is disabled in response to activation of the first sense amplifier enable signal PIOSE_A.

The latch sense amplifier 150 includes first and second load transistors PM1 and PM2, an equalizer EQ, first through fourth driving transistors NM1, NM2, NM3 and NM4, and a switch SW.

In the embodiment of FIG. 1, the first and second load transistors PM1 and PM2 are PMOS transistors. The sources of the PMOS transistors PM1 and PM2 connect to a power supply voltage Vcc, and the gates and drains of the first and second load transistors PM1 and PM2 are cross-coupled. The drains of the PMOS transistors PM1 and PM2 respectively connect to output nodes N1 and N2.

The gates of the first and second driving transistors NM1 and NM2 respectively connect to the signal nodes NA1 and NA2 of the first current sense amplifier 120, and the gates of the third and fourth driving transistors NM3 and NM4 respectively connect to the signal nodes NB1 and NB2 of the second current sense amplifier 130. The drains of the first and second driving transistors NM1 and NM2 respectively connect to the output nodes N1 and N2, which respectively connect to the first and second load transistors PM1 and PM2. The sources of the first and second driving transistors NM1 and NM2 connect to the drains of the third and fourth driving transistors NM3 and NM4, respectively. Accordingly, the first and third driving transistors NM1 and NM3 are connected in series between the output node N1 and the switch SW, and the second and fourth driving transistors NM2 and NM4 are connected in series between the output node N2 and the switch SW.

In the embodiment of FIG. 1, the switch SW is an NMOS transistor that is enabled in response to a latch sense amplifier drive signal PIOSE. The switch SW controls the operation of the latch sense amplifier 150. If the latch sense amplifier drive signal PIOSE is activated to a logic "high" level, the latch sense amplifier 150 is enabled. If the latch sense amplifier drive signal PIOSE is deactivated to a logic "low" level, the latch sense amplifier 150 is disabled.

The equalizer EQ when enabled keeps the output nodes N1 and N2 at the same voltage (Vcc). The equalizer EQ is disabled in response to activation of the latch sense amplifier drive signal PIOSE. In the embodiment of FIG. 1, the equalizer EQ includes an equalizing transistor EQ1 connected between the output nodes N1 and N2 and precharge transistors EQ2 and EQ3 connected between the power supply voltage Vcc and the output nodes N1 and N2, respectively. Accordingly, when the latch sense amplifier drive signal PIOSE is deactivated, the equalizer EQ keeps the output nodes N1 and N2 at the supply voltage Vcc.

The operation of the IO sense amplifier 100 shown in FIG. 1 will now be described for the case where the memory bank A is selected. Initially, both signals PIOSE_A and PIOSE_B are deactivated to the logic "low" level, and the equalizers EQA and EQB are enabled. Each equalizer EQA and EQB keeps respective signal nodes NA1, NA2 and NB1, NB2 at the precharge voltage (Vcc/2). When the memory bank A is selected for a read, the first sense amplifier enable signal PIOSE_A is activated to the logic "high" level, while the second sense amplifier enable signal PIOSE_A remains deactivated at the logic "low" level. Then, the latch sense amplifier drive signal PIOSE for the latch sense amplifier 150 is activated.

Activation of the first sense amplifier enable signal PIOSE_A disables the equalizer EQA and turns on the switch SWA to create current paths between the data lines DIO_A and DIOB_A and ground Vss. For example, assuming that data signals of a logic "high" level and a logic "low" level are on the data line DIO_A and the complementary data line DIOB_A, respectively, the voltage on the signal node NA1 rises. In response, the resistance of the first load transistor PA1 decreases, and the resistance of the second load transistor PA2 increases. Accordingly, a difference in currents from the data lines DIO_A and DIOB_A is generated. Since the first and second load resistors RA1 and RA2 have the same electrical characteristics, a voltage difference corresponding to the current difference is generated between the signal nodes NA1 and NA2. Accordingly, in this example, the voltage on the first signal node NA1 becomes slightly higher than the voltage on the second signal node NA2. The size ratio of PMOS and NMOS transistors in the first current sense amplifier 120 determines voltage level and difference developed on the signal nodes NA1 and NA2, and generally the voltage on each node remains about equal to 1/2Vcc±200 to 300 mV.

While the memory bank A is selected and the first current sense amplifier 120 is in operation, the second sense amplifier enable signal PIOSE_B remains in a deactivated state. Therefore, the second current sense amplifier 130, which is connected to the non-selected memory bank B, does not operate, and the voltage levels of the output nodes NB1 and NB2 are fixed at 1/2 Vcc.

If the latch sense amplifier drive signal PIOSE is activated to a logic "high" level, the latch sense amplifier 150 is enabled, and the equalizer EQ is disable. The voltage level of the first signal node NA1 of the first sense amplifier 120 being higher than the voltage level on the second signal node NA2 reduces the resistance of the first driving transistor NM1 relative to the second driving transistor NM2. Accordingly, the drive transistors NM1 and NM3 pull down the voltage on output node N1 and thereby turn on the PMOS transistor PM2. The PMOS transistor PM2 maintains the output node N2 at a logic "high" level while the voltage level of the first output node N1 goes to a logic "low" level. Drivers 160 and 170 amplify the voltages of the first and second output nodes N1 and N2, respectively and transfer the ground voltage Vss and the power supply voltage Vcc to the data buses FDIO and FDIOB to indicated the data value read from the memory bank A.

The operation of the IO sense amplifier 100 to sense and amplify the data signals on the data lines DIO_B and DIOB_B of the memory bank B is substantially the same as the example operation describe above. However, the signal PIOSE_B is activate to select the memory bank B, and the signal PIOSE_A is deactivated. As a result, the voltages on the signal nodes NA1 and NA2 of the current sense amplifier 120 remain equal. The voltages on the signal nodes NB1 and NB2 of the current sense amplifier 130 acquire a slight difference according to the data signals on the connected data lines DIO_B and DIOB_B. In the latch sense amplifier 150, the drive transistors NM3 and NM4 change resistances according to the voltage difference on the output nodes NB1 and NB2, and the voltages of output nodes N1 and N2 change in response the resistances of the transistors NM3 and NM4. The drivers 160 and 170 amplify the voltages on nodes N1 and N2 to provide data lines FDIO and FDIOB with data from the memory bank B.

As described above, an IO sense amplifier according to the present invention is shared by at least two neighboring memory banks. In particular, at least two banks share the latch sense amplifier, which occupies most of the layout area of the IO sense amplifier. Accordingly, the layout area for sense amplifiers in a memory in accordance with the invention is significantly smaller than the corresponding layout area in a memory having a current sense amplifier and a voltage sense amplifier for each memory bank.

Figure 2:
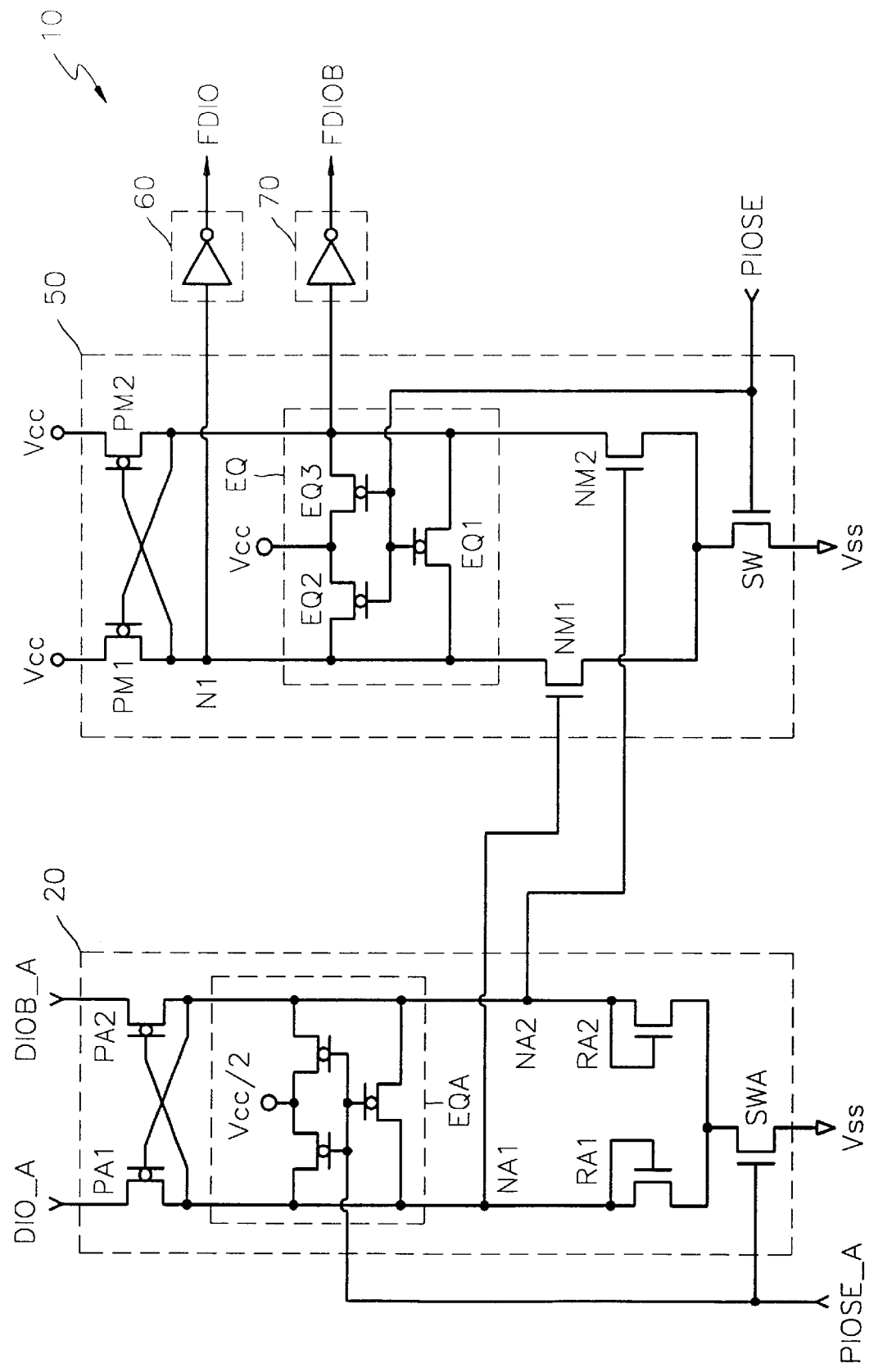
FIG. 2 is a circuit diagram of a sense amplifier for comparison with the IO sense amplifier of FIG. 1.

FIG. 2 illustrates an example an IO sense amplifier 10 for comparison with the embodiment of the invention shown in FIG. 1. The IO sense amplifier 10 is the sense amplifier for a single bank, for example, the memory bank A.

The IO sense amplifier 10 includes a current sense amplifier 20 and a latch sense amplifier 50. Here, the current sense amplifier 20 has the same configuration as that of the current sense amplifier 120 or 130 shown in FIG. 1. The latch sense amplifier 50 has the same configuration as that of the latch sense amplifier 150 shown in FIG. 1, with the exception of only two driving transistors NM1 and NM2 being provided between respective output nodes N1 and N2.

The IO sense amplifier 10 operates in the same manner as described above when the memory bank A is selected. With activation of the first sense amplifier enable signal PIOSE_A and the latch sense amplifier drive signal PIOSE, the current sense amplifier 20 and the latch sense amplifier 50 sense the data signals on the data lines DIO_A and DIOB_A of the memory bank A and provide amplified output signals on the data lines FDIO and FDIOB.

Figure 3:
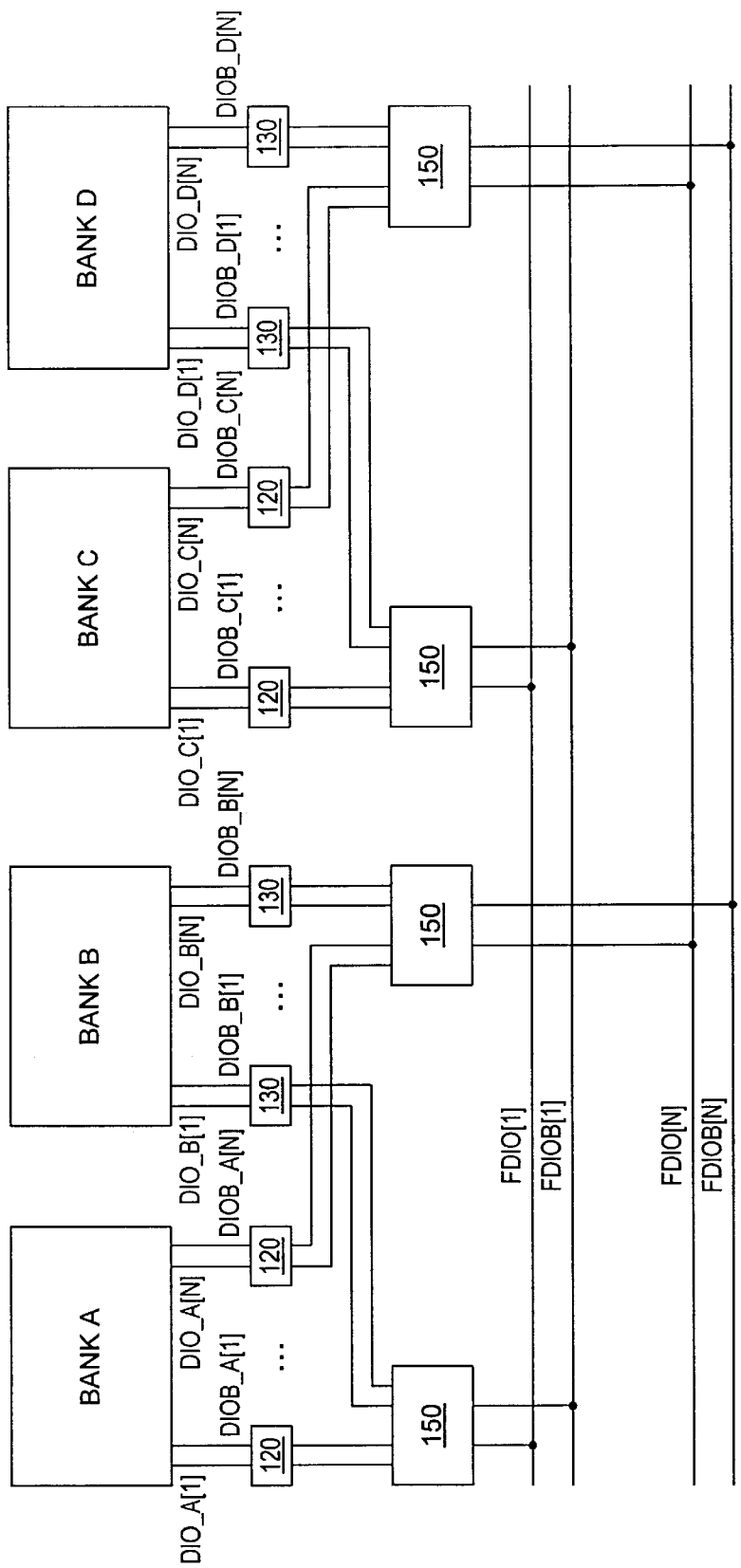
FIG. 3 is a block diagram of a memory device in accordance with an embodiment of the invention.

FIG. 3 is a block diagram of a memory device 300 in accordance with the invention. In an exemplary embodiment, memory device 300 is a synchronous DRAM that includes multiple banks or arrays of DRAM cells. In FIG. 3, memory device 300 has a data width of N-bits and includes four memory banks A, B, C, and D. Accordingly, each bank has N data line pairs and N current sense amplifiers 120 or 130 coupled to the corresponding data line pairs. The memory 300 also has N global data lines FDIO[1:N] and N complementary global data lines FDIOB[1:N]. Banks A and B share a set of N latch sense amplifiers 150, and banks C and D share another set of N latch sense amplifiers 150. Accordingly, memory 300 includes 4N current sense amplifiers 120 or 130 but only 2N latch sense amplifiers 150. Each of the latch sense amplifiers 150 receives signals from a current sense amplifier 120 and a current sense amplifier 130 and generates output data signals for a pair of global data lines.

A memory would need one IO sense amplifier 10 for each data line pair in each memory bank. In other words, two IO sense amplifiers 10 of FIG. 2 correspond to one IO sense amplifier 100 shown in FIG. 1. Therefore, the exemplary embodiment of the present invention reduces the layout area of a memory by requiring one half as many latch sense amplifiers as the example of FIG. 2 requires. Further, layout area reduction can be achieved in an alternative embodiment of the invention where three or more banks share a latch sense amplifier that is connected to the three or more current sense amplifiers associated with the three or more banks.

Although exemplary embodiments of the present invention have been described and particular terms have been used herein, it should be clearly understood that the invention is not limited to those precise embodiments. For example, the specification describes an IO sense amplifier that includes one current sense amplifier and a latch sense amplifier. However, an IO sense amplifier can include a current sense amplifier and a set of multiple latch sense amplifiers to amplify the signal from the current sense amplifier. In keeping with an aspect of the invention, two or more memory banks can share a set of latch sense amplifiers. Thus, the present invention covers the modifications and variations of this invention provided they fall within the scope of the appended claims and their equivalents.

What is claimed is:

1. A memory device having a plurality of memory banks, comprising:
    a plurality of data lines, each data line being connected in a corresponding one of the plurality of memory banks; and
    an input/output (IO) sense amplifier shared by at least two memory banks, for selectively sense-amplifying data of the data line connected to one of the at least two memory banks;
    wherein the IO sense amplifier comprises:
        at least two current sense amplifiers, each current sense amplifier being connected to a corresponding one of the data lines connected in the at least two memory banks, wherein each current sense amplifier senses current flowing through the data line and outputs a voltage indicating a data value on the data line; and
        a latch sense amplifier shared by the at least two current sense amplifiers, for sensing the voltage output from one of the current sense amplifiers and amplifying the same to a level which is enough to be transferred to a peripheral circuit.

2. A memory device having a plurality of memory banks, comprising:
    a plurality of data lines, each data line being connected in a corresponding one of the plurality of memory banks; and
    an input/output (IO) sense amplifier shared by at least two memory banks, for selectively sense-amplifying data of the data line connected to one of the at least two memory banks;
    wherein the IO sense amplifier comprises:
        at least two current sense amplifiers, each current sense amplifier being connected to a corresponding one of the data lines connected in the at least two memory banks, wherein each current sense amplifier senses current flowing through the data line and outputs a voltage indicating a data value on the data line; and
        a latch sense amplifier shared by the at least two current sense amplifiers, for sensing the voltage output from one of the current sense amplifiers and amplifying the same to a level which is enough to be transferred to a peripheral circuit; and wherein each of the current sense amplifiers comprises:
            load transistors, wherein sources of the load transistors are connected to a pair of data lines from a corresponding memory bank, gates and drains of the load transistors are cross-coupled, and the drains are connected to first and second signal nodes;
            load resistors that are implemented by transistors with matched electrical characteristics and drains and gates coupled together, the drains being respectively connected to the first and second signal nodes; and
            a switch connected to sources of the load resistors and controlled by a sense amplifier enable signal that selectively activates the current sense amplifier when the memory device enters a read mode.

3. A memory device having a plurality of memory banks, comprising:
    a plurality of data lines, each data line being connected in a corresponding one of the plurality of memory banks; and
    an input/output (IO) sense amplifier shared by at least two memory banks, for selectively sense-amplifying data of the data line connected to one of the at least two memory banks;
    wherein the IO sense amplifier comprises:
        at least two current sense amplifiers, each current sense amplifier being connected to a corresponding one of the data lines connected in the at least two memory banks, wherein each current sense amplifier senses current flowing through the data line and outputs a voltage indicating a data value on the data line; and
        a latch sense amplifier shared by the at least two current sense amplifiers, for sensing the voltage output from one of the current sense amplifiers and amplifying the same to a level which is enough to be transferred to a peripheral circuit; and wherein the latch sense amplifier comprises:
            load transistors having sources connected to a power supply voltage line, gates and drains cross-coupled, and the drains connected to respective first and second output nodes;
            at least two driving transistors having drains respectively connected to the first and second output nodes, each driving transistor being enabled in response to the output voltage from one of the two current sense amplifiers; and
            a switch controlled by a sense amplifier drive signal for being selectively activated to enable the latch sense amplifier.

4. A memory device comprising:
    a plurality of memory banks;
    a plurality of data line pairs, each data line pair being connected in a corresponding one of the plurality of memory banks;
    a plurality of current sense amplifiers, each current sense amplifier being connected to a corresponding one of the data line pairs; and
    a latch sense amplifier coupled to the plurality of current sense amplifiers, the latch sense amplifier selectively amplifying a signal output from one of the current sense amplifiers.

5. A memory device comprising:
    a plurality of memory banks;
    a plurality of data line pairs, each data line pair being connected in a corresponding one of the plurality of memory banks;
    a plurality of current sense amplifiers, each current sense amplifier being connected to a corresponding one of the data line pairs; and
    a latch sense amplifier coupled to the plurality of current sense amplifiers, the latch sense amplifier selectively amplifying a signal output from one of the current sense amplifiers;
    wherein each of the current sense amplifiers comprises:
        a first load transistor coupled between a first signal node and a first data line, the first data line being from the data line pair corresponding to the current sense amplifier, the first load transistor having a gate coupled to a second signal node;
        a second load transistor coupled between the second signal node and a second data line, the second data line being from the data line pair corresponding to the current sense amplifier, the second load transistor having a gate coupled to the first signal node;
        a switch operated by an enable signal for the current sense amplifier;
        a first resistor between the first signal node and the switch; and a second resistor between the second signal node and the switch.

6. The memory device according to claim 5, wherein the latch sense amplifier comprises:

a first load transistor coupled between a supply voltage and a first output node, the first load transistor having a gate coupled to a second output node;

a second load transistor coupled between the supply voltage and the second output node, the second load transistor having a gate coupled to the first output node;

a switch operated by an enable signal for the latch sense amplifier;

a first plurality of drive transistors connected in series between the first output node and the switch, each of the drive transistors having a gate coupled to the first signal node in a current sense amplifier corresponding to the drive transistor; and a second plurality of drive transistors connected in series between the second output node and the switch, each of the drive transistors in the second plurality having a gate coupled to the second signal node in a current sense amplifier corresponding to the drive transistor.

* * * * *